(12) United States Patent
Chen et al.

(10) Patent No.: US 10,755,405 B2
(45) Date of Patent: Aug. 25, 2020

(54) METHOD AND SYSTEM FOR DIAGNOSING A SEMICONDUCTOR WAFER

(71) Applicant: Taiwan Semiconductor Manufacturing Co., Ltd., Hsinchu (TW)

(72) Inventors: Yen-Liang Chen, Taichung (TW); Jun-Xiu Liu, Taichung (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 246 days.

(21) Appl. No.: 15/919,428

(22) Filed: Mar. 13, 2018

(65) Prior Publication Data
US 2019/0164264 A1 May 30, 2019

Related U.S. Application Data

(60) Provisional application No. 62/590,407, filed on Nov. 24, 2017.

(51) Int. Cl.
  *G06K 9/00* (2006.01)
  *G06T 7/00* (2017.01)
  *H01L 21/66* (2006.01)
  *G01N 21/956* (2006.01)

(52) U.S. Cl.
  CPC ....... *G06T 7/001* (2013.01); *G01N 21/95607* (2013.01); *H01L 22/12* (2013.01); *H01L 22/20* (2013.01); *G06T 2207/30148* (2013.01)

(58) Field of Classification Search
  CPC .......... G01N 21/9501; G01N 21/95607; G06T 2207/30148; G06T 7/001; H01L 22/12; H01L 22/20
  See application file for complete search history.

(56) References Cited

U.S. PATENT DOCUMENTS

| | | | | |
|---|---|---|---|---|
| 6,898,305 | B2 * | 5/2005 | Hiroi | G01N 21/95684 356/394 |
| 10,161,882 | B1 * | 12/2018 | Kaizerman | G06F 17/5081 |
| 2001/0033683 | A1 * | 10/2001 | Tanaka | G06T 7/001 382/149 |
| 2002/0114506 | A1 * | 8/2002 | Hiroi | G06T 7/001 382/149 |
| 2007/0288219 | A1 * | 12/2007 | Zafar | G06T 7/0008 703/14 |
| 2008/0181484 | A1 * | 7/2008 | Litichever | G06T 7/001 382/145 |
| 2009/0226075 | A1 * | 9/2009 | Hiroi | G06T 7/001 382/149 |

(Continued)

*Primary Examiner* — Ian L Lemieux
(74) *Attorney, Agent, or Firm* — McClure, Qualey & Rodack, LLP

(57) ABSTRACT

Methods and systems for diagnosing a semiconductor wafer are provided. A first raw image, a second raw image, and a third raw image of the semiconductor wafer are obtained by an inspection apparatus according to graphic data system (GDS) information regarding layout of a target die. A first image-based comparison is performed by a determining circuitry on the first, second, and third raw images, so as to provide a comparison result. The comparison result indicates whether an image difference is present between the first, second, and third raw images.

20 Claims, 10 Drawing Sheets

(56) References Cited

U.S. PATENT DOCUMENTS

| | | | | |
|---|---|---|---|---|
| 2011/0298915 A1* | 12/2011 | Hiroi | ............ | G06T 7/001 |
| | | | | 348/80 |
| 2013/0070078 A1* | 3/2013 | Takagi | ............ | G06T 7/001 |
| | | | | 348/80 |
| 2013/0217154 A1* | 8/2013 | Fukazawa | ............ | G03F 9/7026 |
| | | | | 438/7 |
| 2014/0219543 A1* | 8/2014 | Kuo | ............ | G06T 7/001 |
| | | | | 382/149 |
| 2014/0294283 A1* | 10/2014 | Takeda | ............ | G06T 7/001 |
| | | | | 382/144 |
| 2016/0012579 A1* | 1/2016 | Shi | ............ | G06T 7/001 |
| | | | | 382/149 |
| 2016/0110859 A1* | 4/2016 | Luoh | ............ | G06T 7/001 |
| | | | | 382/149 |
| 2017/0309008 A1* | 10/2017 | Shi | ............ | G06T 7/001 |
| 2018/0238816 A1* | 8/2018 | Sousa | ............ | G03F 1/84 |

\* cited by examiner

METHOD AND SYSTEM FOR DIAGNOSING A SEMICONDUCTOR WAFER

CROSS REFERENCE TO RELATED APPLICATIONS

This Application claims priority of U.S. Provisional Application No. 62/590,407, filed on Nov. 24, 2017, the entirety of which is incorporated by reference herein.

BACKGROUND

In semiconductor technology, the wafers, each having multiple dies, are produced by a plurality of processes and stages in a wafer fabrication facility (FAB). Each process or stage may introduce one or more defects into the semiconductor wafer, which leads to quality and reliability issues, failures, and yield losses. To improve manufacturing technology and enhance wafer quality, reliability, and yield, the semiconductor wafers are measured, tested, monitored, and diagnosed at each process and at each stage.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
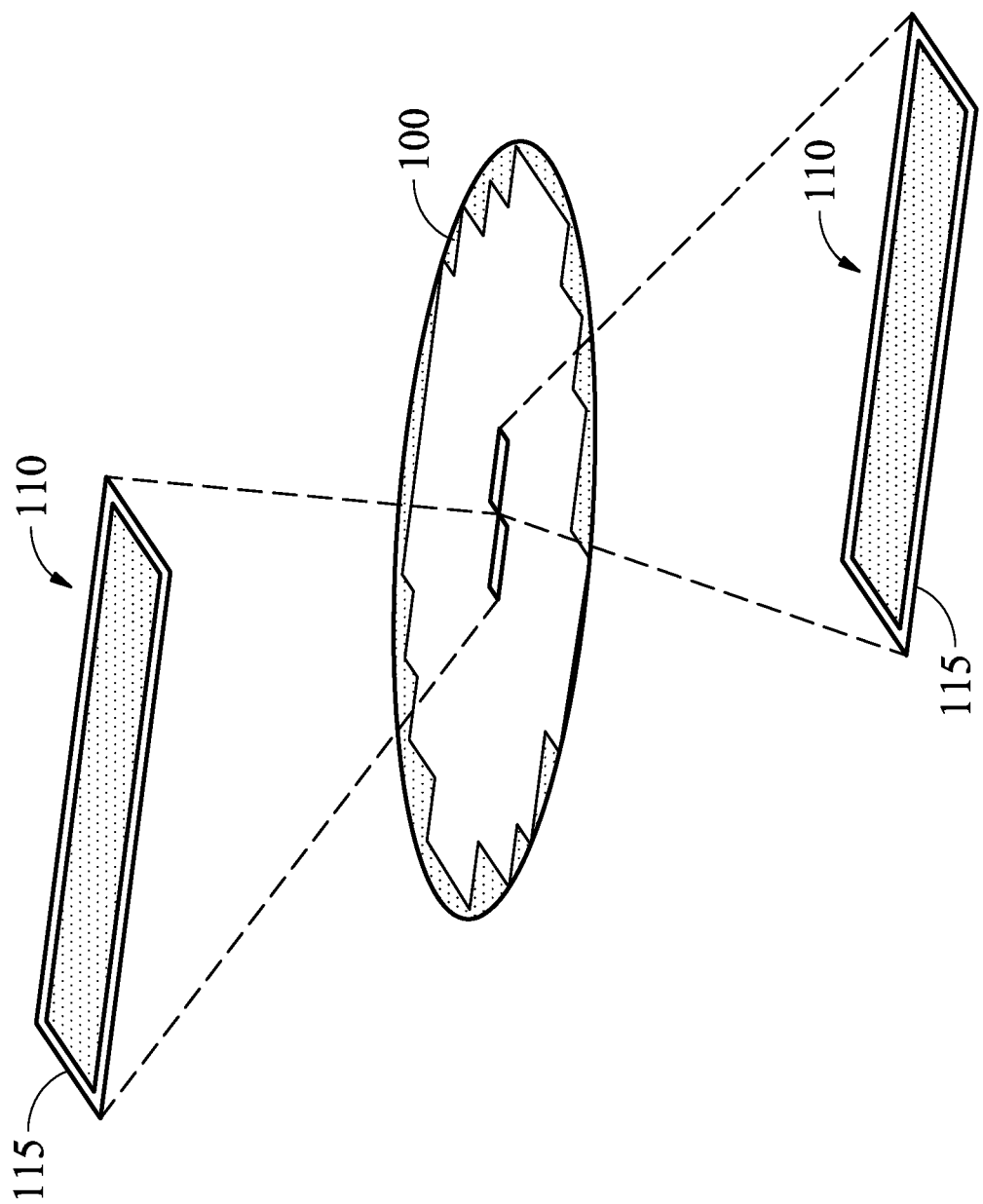
FIG. 1 shows a semiconductor wafer 100 to be inspected, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

In integrated circuit (IC) design, a variety of functions are integrated into one chip, and an application specific integrated circuit (ASIC) or system on a chip (SOC) cell based design is often used. In this approach, a library of known functions is provided, and after the functional design of the device is specified by choosing and connecting these standard functions, and proper operation of the resulting circuit is verified using electronic design automation (EDA) tools, the library elements are mapped on to predefined layout cells, which contain prefigured elements such as transistors. The cells are chosen with the particular semiconductor process features and parameters in mind to create a process parameterized physical representation of the design. The design flow continues from that point by performing placement and routing of the local and global connections needed to form the completed design using the standard cells.

After design rule checks, design rule verification, timing analysis, critical path analysis, static and dynamic power analysis, and final modifications to the design, a tape-out process is performed to produce photomask generation data. This photomask generation (PG) data is then used to create the optical masks used to fabricate the semiconductor device in a photolithographic process at a wafer fabrication facility (FAB). In the tape-out process, the database file of the IC is converted into a Graphic Database System (GDS) file (e.g. a GDS file or a GDSII file). The GDS file is then used to make various layers of masks for integrated circuit manufacturing. Specifically, the GDS file became the industry's standard format for transfer of IC layout data between design tools of different vendors.

Inspection processes are used in various steps of the semiconductor manufacturing process to detect defects on wafers according to GDS files, so as to promote higher yield in the manufacturing process and thus higher profits. Furthermore, as the dimensions of semiconductor devices decrease, inspection becomes even more important to the successful manufacture of acceptable semiconductor devices because smaller defects can cause the devices to fail. For instance, as the dimensions of semiconductor devices decrease, the detection of smaller defects has become necessary since even relatively small defects may cause aberrations in the semiconductor devices. Moreover, as design rules shrink, semiconductor manufacturing processes may be operating closer to the limitations on the performance capability of the processes, and smaller defects can have an impact on the electrical parameters of the device.

FIG. 1 shows a semiconductor wafer 100 to be inspected, in accordance with some embodiments of the disclosure. The semiconductor wafer 100 includes multiple dies 110. The dies 110 are identical and separated from each other by the scribing lines 115. During various processes, the semiconductor wafer 100 is inspected to detect defects on the dies 110. The defects are related to insufficient space and/or line width margins. For example, a critical dimension of the semiconductor wafer 100, a width or a length of a first feature (e.g. the width/length of conductive line), or a distance between the first feature and a second feature (e.g. the space between two conductive lines, or active area). If an inspection result is normal, the subsequent process or stage is performed on the semiconductor wafer 100. If the semiconductor wafer 100 has not been completed, the next process is performed on the semiconductor wafer 100. Similarly, after performing the next process, the semiconductor wafer 100 will be inspected again until all the processes of the semiconductor wafer 100 have been completed. If the semiconductor wafer 100 has been completed, the semiconductor wafer 100 is diced along the scribing lines 115, and the dies 110 are obtained. Next, multiple integrated circuits (ICs) are fabricated based on the obtained dies 110.

Figure 2:
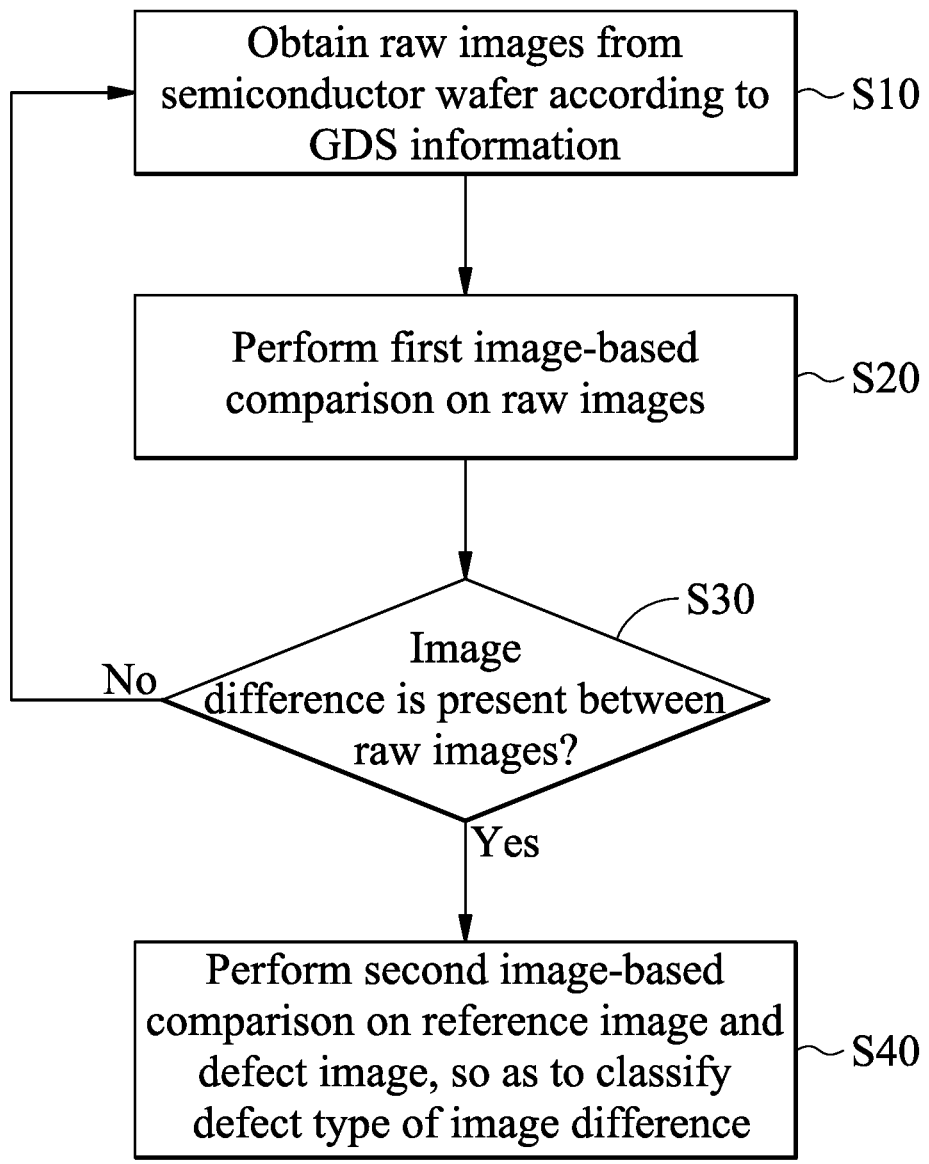
FIG. 2 shows a simplified flowchart of a method for diagnosing the semiconductor wafer of FIG. 1, in accordance with some embodiments of the disclosure.

FIG. 2 shows a simplified flowchart of a method for diagnosing the semiconductor wafer 100 of FIG. 1, in accordance with some embodiments of the disclosure. It should be noted that additional processes may be provided before, during, and/or after the method of FIG. 2, and that some processes may only be briefly described herein. Furthermore, the method of FIG. 2 can be performed in one or more process or stage of manufacturing the semiconductor wafer 100. At least one semiconductor wafer 100 is inspected by an inspection apparatus. As described above, the semiconductor wafer 100 includes multiple dies 110. Furthermore, the dies 110 have the same circuits and the same structures corresponding to a target die.

In operation S10, when the semiconductor wafer 100 is inspected by the inspection apparatus, the inspection apparatus is capable of obtaining three raw images IMGr_1, IMGr_2 and IMGr_3, such as more than two raw images, from the semiconductor wafer 100 according to a GDS file regarding a specific layout of the target die. In some embodiments, the inspection apparatus obtains the three raw images IMGr_1, IMGr_2 and IMGr_3 via optical, electron beam, UV light, visible light, invisible light, or laser surface scan. Furthermore, the specific layout of the target die represents the features (e.g., space and/or line width) of the target die prone to defects. In some embodiments, the raw images IMGr_1, IMGr_2 and IMGr_3 are captured from different dies 110 of the semiconductor wafer 100. In some embodiments, the raw images IMGr_1, IMGr_2 and IMGr_3 are captured from the different positions in the same die 110 of the semiconductor wafer 100. The relationships of the raw images IMGr_1, IMGr_2 and IMGr_3 will be described below.

In operation S20, a first image-based comparison is performed on the raw images IMGr_1, IMGr_2 and IMGr_3. After the first image-based comparison is completed, a comparison result is obtained.

In operation S30, it is determined whether one of more image differences are present between the raw images IMGr_1, IMGr_2 and IMGr_3 according to the comparison result obtained in operation S20.

If no image difference is detected in the first image-based comparison of operation S20, the comparison result indicates that the raw images IMGr_1, IMGr_2 and IMGr_3 are the same. Next, the operation S10 of the flowchart in FIG. 2 is performed again, so as to obtain new raw images IMGr_1, IMGr_2 and IMGr_3. In some embodiments, the new raw images IMGr_1, IMGr_2 and IMGr_3 are captured from the dies 110 different from the dies 110 corresponding to the previous raw images IMGr_1, IMGr_2 and IMGr_3. In some embodiments, the new raw images IMGr_1, IMGr_2 or IMGr_3 is captured from the identical die 110 corresponding to the previous raw images IMGr_1, IMGr_2 or IMGr_3.

If an image difference between the raw images IMGr_1, IMGr_2 and IMGr_3 is detected in the first mage-based comparison of operation S20, the comparison result includes information regarding which raw image is a defect image having the image difference, and a location of the image difference in the defect image. In some embodiments, the raw image having the image difference is assigned as the defect image.

If the defect image is detected from the raw images IMGr_1, IMGr_2 or IMGr_3, a second image-based comparison is performed on the defect image and a reference image IMG_REF in operation S40. By comparing the defect image with the reference image IMG_REF, the defect type of each image difference of the defect image is classified, thereby various defect types in the defect image can be detected when the second image-based comparison is performed. In some embodiments, the reference image IMG_REF is the previous raw images IMGr_1, IMGr_2 or IMGr_3 without the image difference.

In some embodiments, the reference image IMG_REF is captured from a golden wafer. The golden wafer is selected from a lot of semiconductor wafers 100, and the golden wafer is used as a template wafer to measure, test, monitor or diagnose the other semiconductor wafers 100 in the lot of semiconductor wafers 100. The reference image IMG_REF is used to perform measurement for the other semiconductor wafers 100, so as to verify these semiconductor wafers 100.

In some embodiments, the reference image IMG_REF is captured from a golden die 110 of the semiconductor wafer 100. The golden die is selected from a lot of dies 110 of the same semiconductor wafer 100, and the golden die is used as a template die to measure, test, monitor or diagnose the other dies 110 in the semiconductor wafer 100. The reference image IMG_REF is used to perform measurement for the other dies 110 of the semiconductor wafer 100, so as to verify these dies 110.

The reference image IMG_REF is a template for diagnosing the semiconductor wafer 100 in a specific process or stage. In some embodiments, each process or stage has its own reference image IMG_REF. Moreover, the specific layout is a fractional layout of the target die. The fractional layout includes a multi-layer structure of the target die. In some embodiments, the reference image IMG_REF includes information regarding a pattern contour corresponding to the specific layout in the semiconductor wafer 100.

The multi-layer structure includes a first layer having multiple features, and a second layer having multiple features. Furthermore, the first layer is disposed on or under the second layer, and a cross-layer structure is formed.

If the classified defect type has no effect on the die 110 corresponding to the defect image, the subsequent process or stage is performed on the semiconductor wafer 100. If the classified defect type has a great impact on the die 110, an improvement procedure is performed through masks, layout and/or processes.

In some embodiments, when each raw image IMGr_1, IMGr_2 or IMGr_3 is captured from the semiconductor wafer 100, the second image-based comparison of operation S40 is performed on the captured raw image and the reference image IMG_REF, so as to verify the semiconductor wafer 100. Thus, the operations S20 and S30 of FIG. 2 may be omitted.

Figure 3:
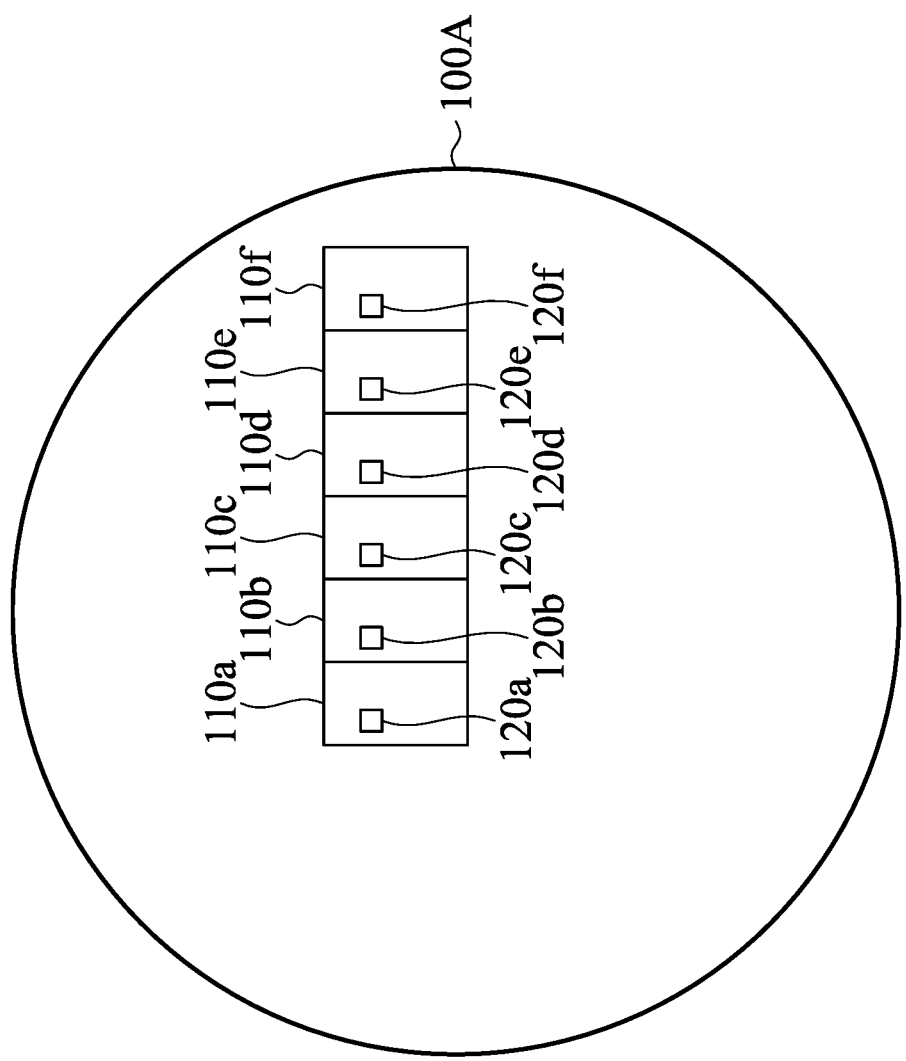
FIG. 3 shows a semiconductor wafer to be inspected, in accordance with some embodiments of the disclosure.

FIG. 3 shows a semiconductor wafer 100A to be inspected, in accordance with some embodiments of the disclosure. The semiconductor wafer 100A includes the dies 110a-110f. In such embodiments, other dies are omitted in the semiconductor wafer 100A for simplicity of explanation.

The dies 110a-110f have the same circuits and the same structures corresponding to a target die. Moreover, the dies 110a-110f have individual coordinates in the semiconductor wafer 100A. Furthermore, each of the dies 110a-110f has an area corresponding to a GDS file regarding a specific layout of the target die. For example, the area 120a of the die 110a has a first group of coordinates (e.g., X-coordinate and Y-coordinate) (or position) on the die 110a, and the area 120b of the die 110b has a second group of coordinates (or position) on the die 110b. The first and second coordinates are the same for the dies 110a and 110b, i.e. the first and second groups of coordinates corresponding to the same features in the specific layout of the target die.

Figure 4A:
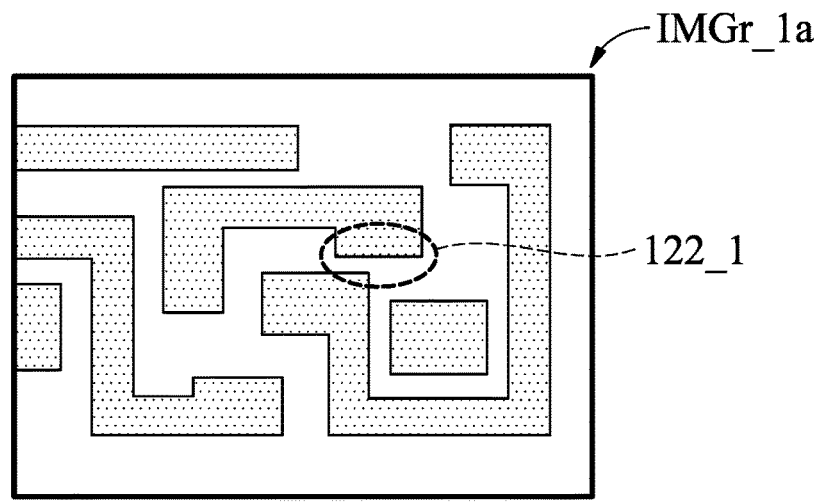
FIGS. 4A-4C show schematic views illustrating various examples of the raw images obtained from the dies of the semiconductor wafer of FIG. 3.
Figure 4B:
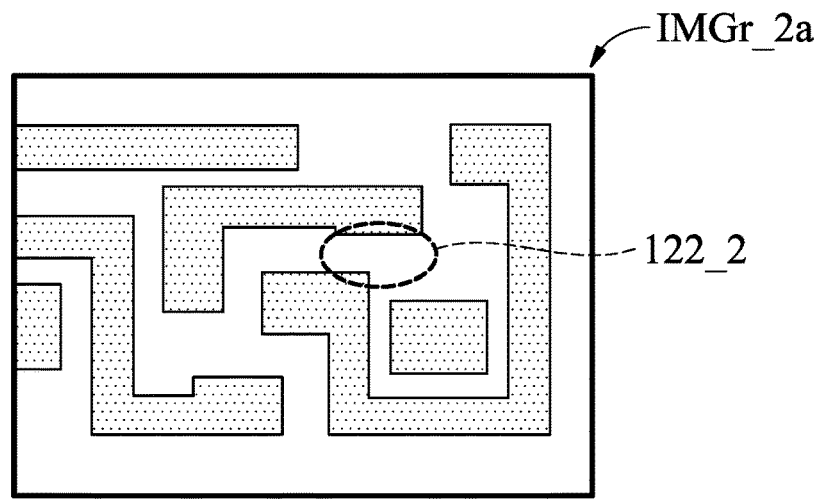
Figure 4C:
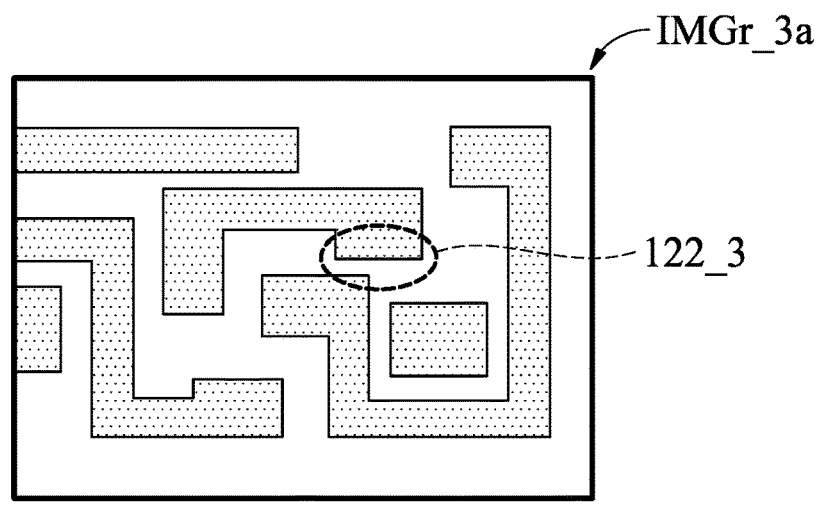

When the semiconductor wafer 100A of FIG. 3 is inspected by an inspection apparatus (in operation S10 of FIG. 2), the inspection apparatus is configured to obtain the raw image IMGr_1a (as shown in FIG. 4A) from the die 110a, the raw image IMGr_2a (as shown in FIG. 4B) from the die 110b, and the raw image IMGr_3a (as shown in FIG. 4C) from the die 110c in the semiconductor wafer 100 according to a GDS file regarding the specific layout of the target die. In such embodiments, the number of raw images IMGr_1a, IMGr_2a, and IMGr_3a is used as an example. In some embodiments, the number of raw images being used to perform a first image-based comparison is greater than or equal to 3. As described above, the specific layout of the target die represents the features (e.g., space and/or line width) of the target die prone to defects. In response to the specific layout of the target die, the inspection apparatus captures the raw images corresponding to the specific layout of a part of areas in the target die rather than the whole target die. Therefore, tooling time of the inspection apparatus is decreased for capturing the raw images. Furthermore, measurement is accurate due to higher image resolution, thereby increasing the accuracy of comparison.

After obtaining the raw images IMGr_1a, IMGr_2a and IMGr_3a, a first image-based comparison is performed on the raw images IMGr_1a of FIG. 4A, IMGr_2a of FIG. 4B, and IMGr_3a of FIG. 4C (in operation S20 of FIG. 2). After the first image-based comparison is completed, it is determined that an image difference is present between the raw images IMGr_1a, IMGr_2a and IMGr_3a (in operation S30 of FIG. 2). For example, a space 122_1 in the raw image IMGr_1a of FIG. 4A is the same as a space 122_3 in the raw image IMGr_3a of FIG. 4C. Furthermore, the space 122_1 in the raw image IMGr_1a of FIG. 4A is shorter than a space 122_2 in the raw image IMGr_2a of FIG. 4B. Thus, a comparison result is obtained, and the comparison result includes information regarding that the raw image IMGr_2a of FIG. 4B is assigned as a defect image having the image difference (e.g., the larger space 122_2), and the coordinates (or position) of the image difference in the raw image IMGr_2a of FIG. 4B.

In some embodiments, the image difference is obtained by comparing the shape difference of the features in the raw images IMGr_1a, IMGr_2a and IMGr_3a. In some embodiments, the image difference is obtained by comparing the difference between light and dark contrast of the features in the raw images IMGr_1a, IMGr_2a and IMGr_3a.

After detecting that the image difference is present in the raw image IMGr_2a of FIG. 4B, a second image-based comparison is performed on the raw image IMGr_2a of FIG. 4B and a reference image IMG_REF (in operation S40 of FIG. 2), so as to classify the defect type of the image difference in the raw image IMGr_2a of FIG. 4B. As described above, the reference image IMG_REF is the previous raw image without the image difference or a golden image captured from a golden wafer or a golden die.

If the classified defect type has no effect on the die 110b corresponding to the raw image IMGr_2a of FIG. 4B, such as the size of the space 122_2 of FIG. 4B is within the allowable range, the remaining dies are diagnosed for the semiconductor wafer 100A. For example, the inspection apparatus is configured to obtain new raw image IMGr_1 (not shown) from the die 110d, new raw image IMGr_2 (not shown) from the die 110e, and new raw image IMGr_3 (not shown) from the die 110f in the semiconductor wafer 100A of FIG. 3, so as to perform a first image-based comparison on the raw image IMGr_1 from the die 110d, the raw image IMGr_2 from the die 110e, and the raw image IMGr_3 from the die 110f, and then the subsequent operations are performed according to a comparison result of the current first image-based comparison.

In some embodiments, if the classified defect type has no effect on the die 110b corresponding to the raw image IMGr_2a of FIG. 4B, the remaining dies are diagnosed with the previous raw images without the image difference (e.g., the raw image IMGr_1a of FIG. 4A or the raw image IMGr_3a of FIG. 4C) for the semiconductor wafer 100A. For example, the inspection apparatus is configured to obtain the new raw image IMGr_1 (not shown) from the die 110d, and the new raw image IMGr_2 (not shown) from the die 110e in the semiconductor wafer 100A of FIG. 3, so as to perform a first image-based comparison on the raw image IMGr_1 from the die 110d, the raw image IMGr_2 from the die 110e, and the previous raw image IMGr_1a of FIG. 4A or IMGr_3a of FIG. 4C, and then the subsequent operations are performed according to a comparison result of the current first image-based comparison.

Figure 5:
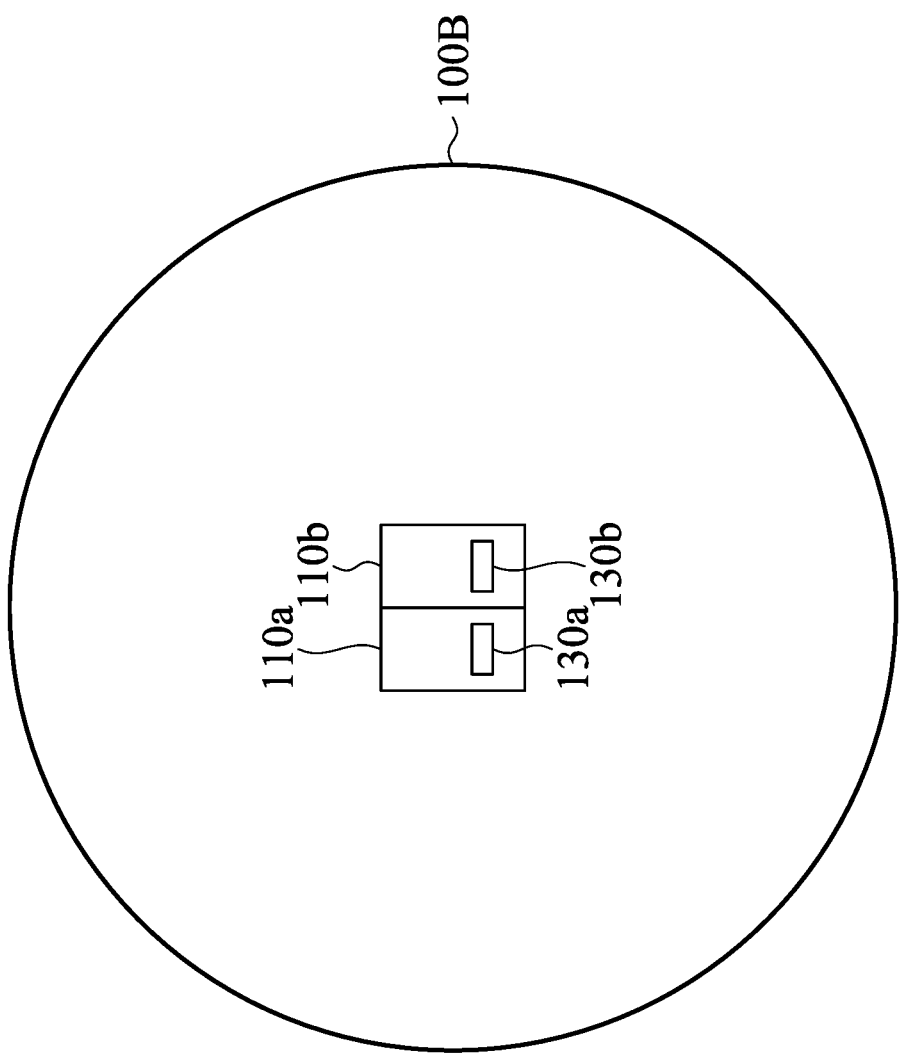
FIG. 5 shows a semiconductor wafer to be inspected, in accordance with some embodiments of the disclosure.

FIG. 5 shows a semiconductor wafer 100B to be inspected, in accordance with some embodiments of the disclosure. The semiconductor wafer 100B includes the dies 110a and 110b. In such embodiments, other dies are omitted in the semiconductor wafer 100B for simplicity of explanation.

The dies 110a and 110b have the same circuits and the same structures corresponding to a target die. Furthermore, each of the dies 110a and 110b has an area corresponding to a GDS file regarding a specific layout of the target die. For example, the area 130a of the die 110a has a first group of coordinates (or position) on the die 110a, and the area 130b of the die 110b has a second group of coordinates (or position) on the die 110b. The first and second groups of coordinates are the same for the dies 110a and 110b, i.e. the first and second groups of coordinates corresponding to the same features in the specific layout of the target die. In such embodiments, the areas 130a and 130b correspond to a specific circuit with duplicate layout, such as a memory array formed by multiple memory cells.

Figure 6:
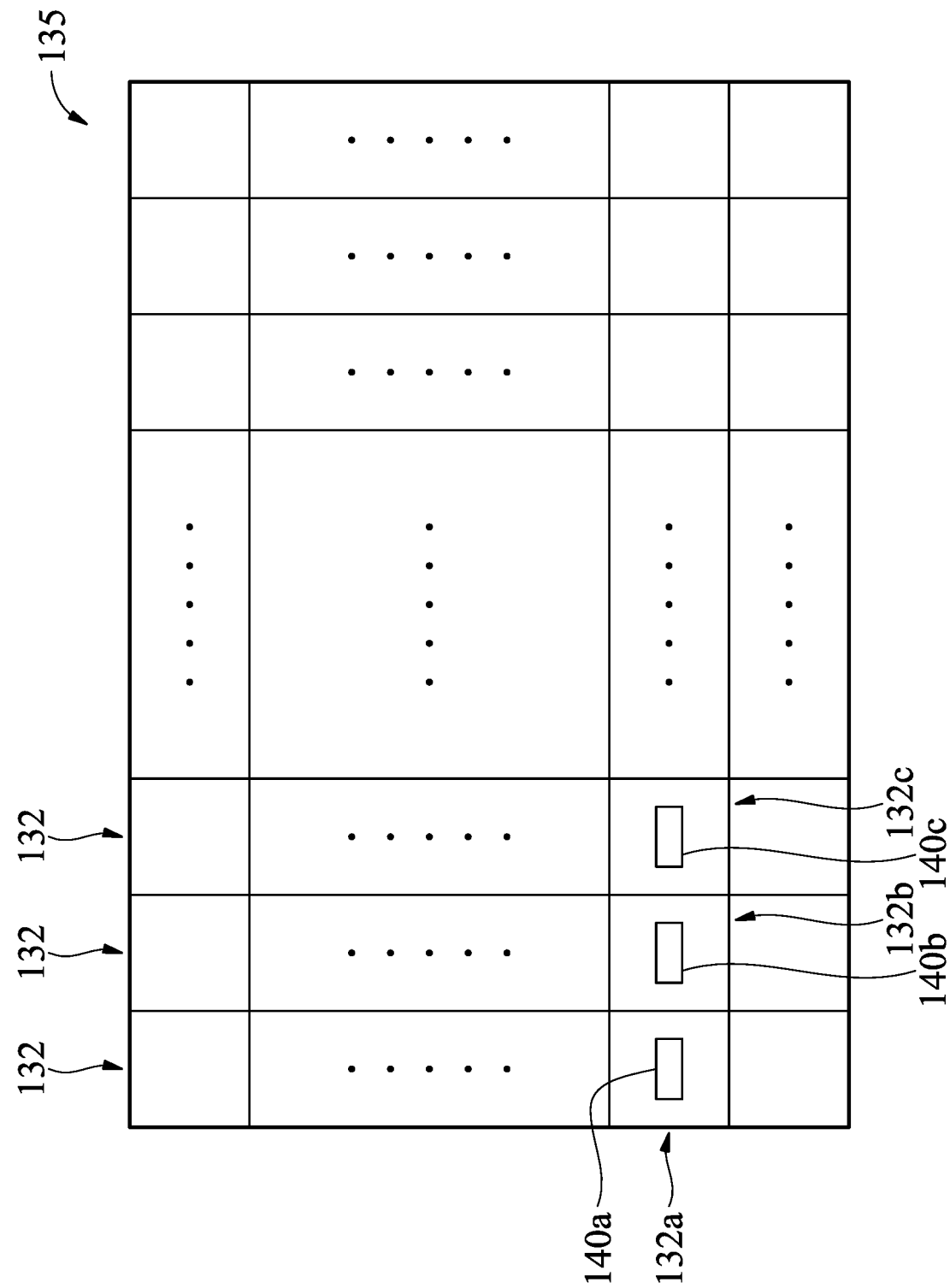
FIG. 6 shows a schematic view illustrating an example of a memory array of the target die corresponding to the areas in the semiconductor wafer of FIG. 5, in accordance with some embodiments of the disclosure.

FIG. 6 shows a schematic view illustrating an example of a memory array 135 of the target die corresponding to the areas 130*a* and 130*b* in the semiconductor wafer 100B of FIG. 5, in accordance with some embodiments of the disclosure. The memory array 135 includes multiple memory cells 132 arranged in rows and columns, and the memory cells 132 have the same circuit and the same structure. For example, the memory array 135 is a SRAM memory array, and each memory cell 132 is a bit cell, such as a six-transistor (6T), 8T, 10T cell and so on.

Figure 7A:
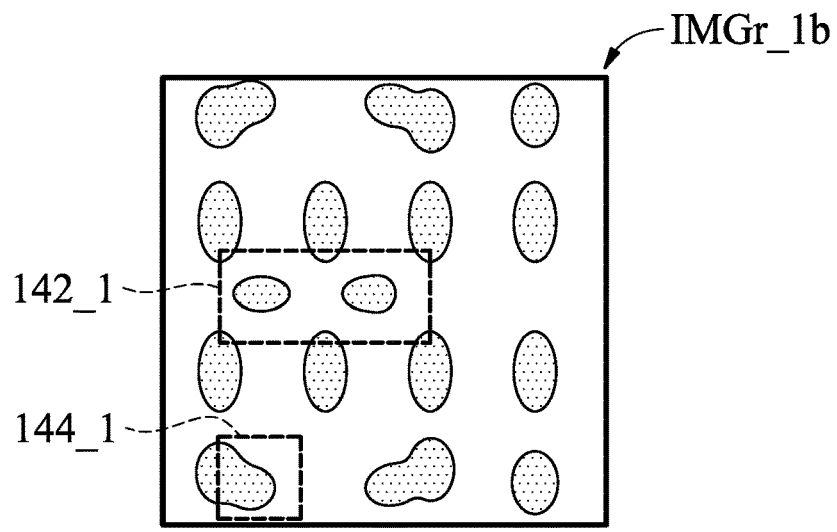
FIGS. 7A-7C show schematic views illustrating various examples of the raw images obtained from the memory array of FIG. 6.
Figure 7B:
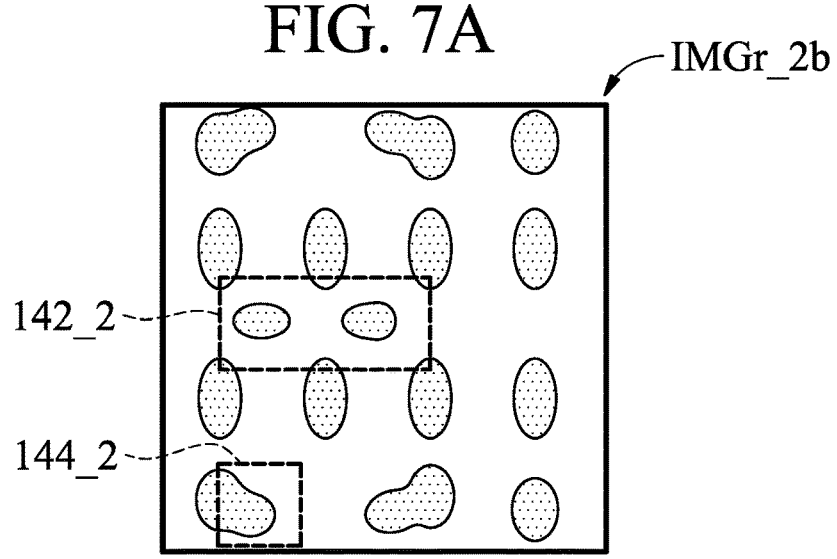
Figure 7C:
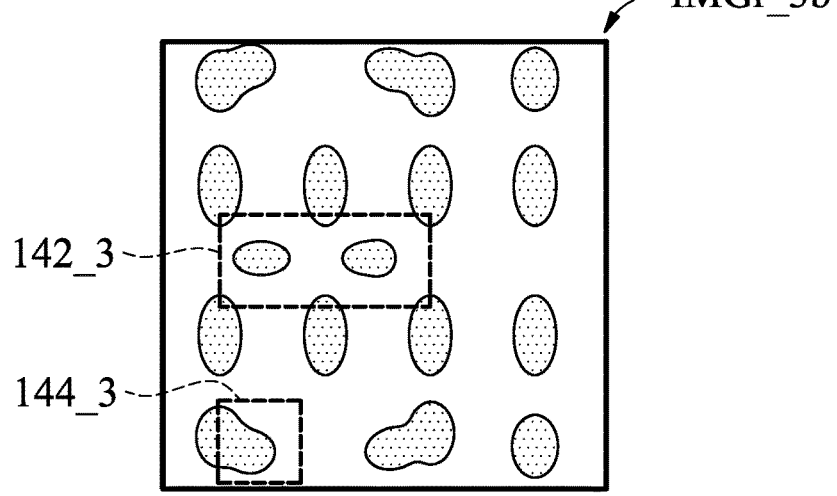

When the semiconductor wafer 100B of FIG. 5 is inspected by an inspection apparatus (in operation S10 of FIG. 2), the inspection apparatus is configured to obtain the raw image IMGr_1*b* (as shown in FIG. 7A) from the area 140*a* of the memory cell 132*a*, the raw image IMGr_2*b* (as shown in FIG. 7B) from the area 140*b* of the memory cell 132*b*, and the raw image IMGr_3*b* (as shown in FIG. 7C) from the area 140*c* of the memory cell 132*c* on the die 110*a* according to a GDS file regarding the specific layout of the target die. In such embodiments, the areas 140*a*, 140*b* and 140*c* has the different coordinates (or positions) on the die 110*a*. Moreover, the memory cells 132*a*-132*c* have individual coordinates on the die 110*a*. Furthermore, the specific layout of the target die is a duplicate layout that represents the features (e.g., space and/or line width) of the target die prone to defects. In response to the specific layout of the target die, the inspection apparatus captures the raw images corresponding to the specific layout of a part of areas in the target die rather than the whole target die. Therefore, tooling time of the inspection apparatus is decreased for capturing the raw images. Furthermore, measurement is accurate due to higher image resolution, thereby increasing the accuracy of comparison.

After obtaining the raw images IMGr_1*b*, IMGr_2*b* and IMGr_3*b*, a first image-based comparison is performed on the raw images IMGr_1*b* of FIG. 7A, IMGr_2*b* of FIG. 7B, and IMGr_3*b* of FIG. 7C (in operation S20 of FIG. 2). After the first image-based comparison is completed, it is determined whether one or more image differences are present between the raw images IMGr_1*b*, IMGr_2*b* and IMGr_3*b* (in operation S30 of FIG. 2).

In some embodiments, due to higher image resolution, various features can be compared in the first image-based comparison. Thus, various defect types can be detected when the first image-based comparison is performed. For example, in the first image-based comparison, the space 142_1 shown in the raw image IMGr_1*b* of FIG. 7A, the space 142_2 shown in the raw image IMGr_2*b* of FIG. 7B, and the space 142_3 shown in the raw image IMGr_1*c* of FIG. 7C can be compared in the first image-based comparison. Furthermore, the contour (of shape) 144_1 shown in the raw image IMGr_1*b* of FIG. 7A, the contour 144_2 shown in the raw image IMGr_2*b* of FIG. 7B, and the contour 144_3 shown in the raw image IMGr_3*b* of FIG. 7C can also be compared in the first image-based comparison.

As described above, if an image difference is present in the raw image IMGr_1*b* of FIG. 7A, IMGr_2*b* of FIG. 7B or IMGr_3*b* of FIG. 7C, a second image-based comparison is performed on the defect image having the image difference and a reference image IMG_REF (in operation S40 of FIG. 2), so as to classify the defect type of the image difference in the defect image. In some embodiments, the current process or stage is suspended for checking according to the classified defect type of the image difference.

In some embodiments, the image difference is obtained by comparing the shape difference of the features in the raw images IMGr_1*b*, IMGr_2*b* and IMGr_3*b*. In some embodiments, the image difference is obtained by comparing the difference between light and dark contrast of the features in the raw images IMGr_1*b*, IMGr_2*b* and IMGr_3*b*.

Conversely, if no image difference is present in the raw image IMGr_1*b* of FIG. 7A, IMGr_2*b* of FIG. 7B or IMGr_3*b* of FIG. 7C, the remaining dies of the semiconductor wafer 100B are diagnosed, such as the die 110*b*.

Figure 8:
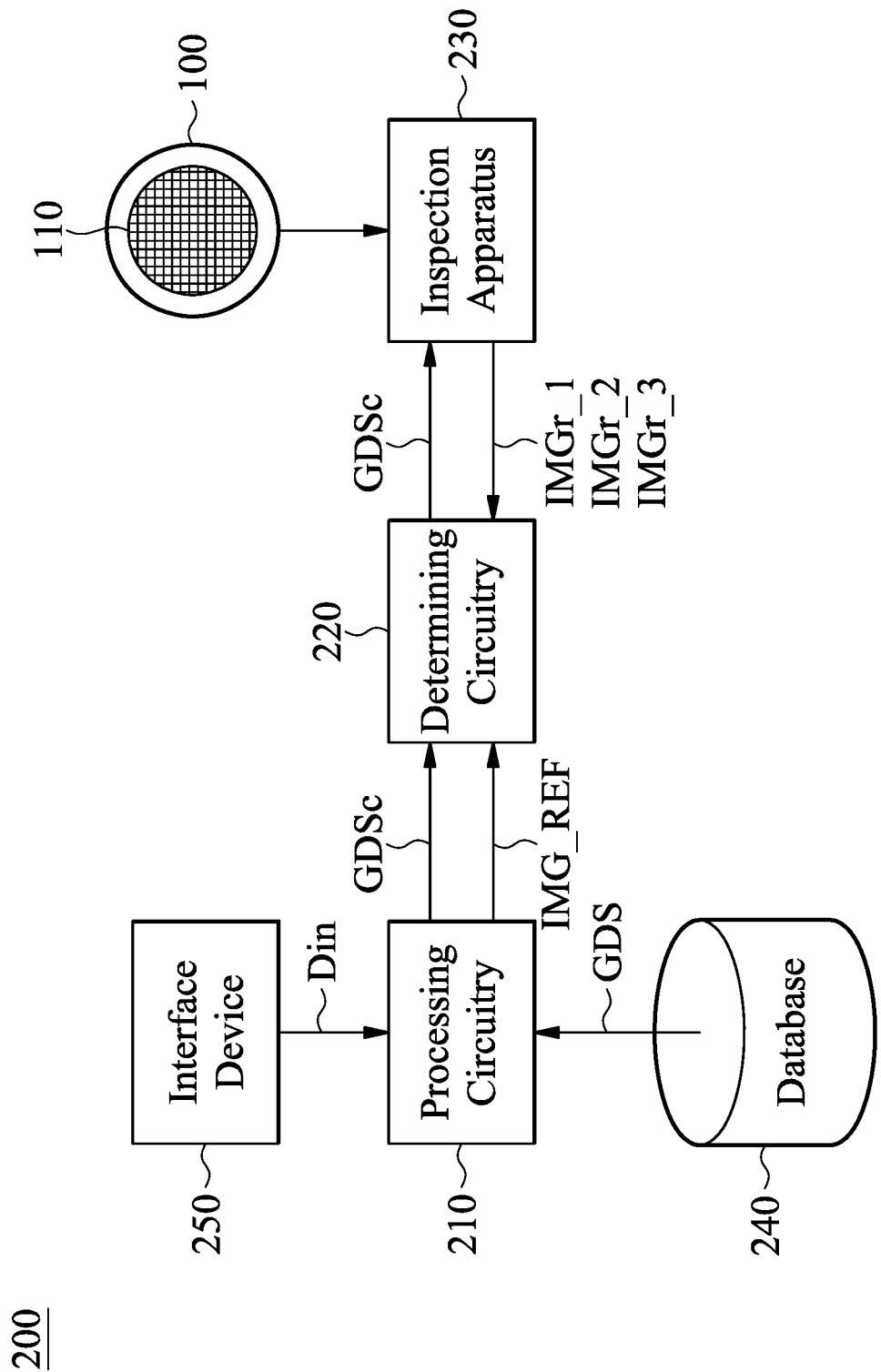
FIG. 8 shows a simplified diagram of a system for diagnosing a semiconductor wafer, in accordance with some embodiments of the disclosure.

FIG. 8 shows a simplified diagram of a system 200 for diagnosing a semiconductor wafer 100, in accordance with some embodiments of the disclosure. The system 200 includes a processing circuitry 210, determining circuitry 220, and an inspection apparatus 230.

Multiple dies 110 will be implemented in the semiconductor wafer 100 via the various processes and stages performed at a wafer fabrication facility. When each process or stage is performed, the semiconductor wafer 100 will be verified and diagnosed via the system 200.

The semiconductor wafer 100 to be diagnosed is loaded in the inspection apparatus 230. In some embodiments, the inspection apparatus 230 can be an image capturing mechanism, and the image capturing mechanism is capable of capturing a raw image from the semiconductor wafer 100.

In some embodiments, the system 200 further includes an interface device 250, and a database 240.

The processing circuitry 210 can obtain a graphic database system file GDS of the target die to be implemented in the semiconductor wafer 100. In some embodiments, the file GDS is obtained from the database 240. In some embodiments, the file GDS is obtained from a remote server.

Furthermore, the processing circuitry 210 can further obtain a user input Din from the interface device 250. In some embodiments, the user input Din includes information regarding coordinates and patterns prone to defects in the layout of the target die.

In the system 200, the processing circuitry 210 can obtain GDS information in the file GDS. In response to the information of the user input Din, the processing circuitry 210 can clip the GDS information to provide the clipped GDS information GDSc, thereby providing increased flexibility based on improvement in handling customized requirements. In some embodiments, the clipped GDS information GDSc includes the information regarding coordinates and patterns prone to defects in the layout of the target die.

In some embodiments, the file GDS includes layout information about each layer of the target die of the semiconductor wafer 100. The processing circuitry 210 can provide the clipped GDS information GDSc for the corresponding layer of the semiconductor wafer 100.

The clipped GDS information GDSc includes little layout information, thus it is difficult to effectively and sufficiently gather information from the clipped GDS information GDSc. Therefore, information regarding circuit design and circuit layout of the target die can be kept secret.

In some embodiments, the processing circuitry 210 can provide the clipped GDS information GDSc to the inspection apparatus 230 via the determining circuitry 220. In some embodiments, the processing circuitry 210 can be implemented in the determining circuitry 220.

In some embodiments, the processing circuitry 210 can obtain a reference image IMG_REF from the database 240 or the interface device 250, and provides the reference image IMG_REF to the determining circuitry 220 for a second image-based comparison of operation S40 of FIG. 2. As described above, the reference image IMG_REF is captured from a golden die or a golden semiconductor wafer in advance.

According to the clipped GDS information GDSc, the inspection apparatus 230 can capture the raw images IMGr_1, IMGr_2, and IMGr_3 from the loaded semiconductor wafer 100. For example, the inspection apparatus 230 can perform a positioning operation so as to capture the raw images IMGr_1, IMGr_2, and IMGr_3 according to the coordinates within the clipped GDS information GDSc.

After capturing the raw images IMGr_1, IMGr_2, and IMGr_3, the inspection apparatus 230 outputs the raw images IMGr_1, IMGr_2, and IMGr_3 to the determining circuitry 220. Next, the determining circuitry 220 can perform a first image-based comparison on the raw images IMGr_1, IMGr_2, and IMGr_3, so as to detect whether one or more image differences are present between the raw images IMGr_1, IMGr_2 and IMGr_3.

In some embodiments, the image difference is obtained by comparing the shape difference of the features in the raw images IMGr_1, IMGr_2 and IMGr_3. In some embodiments, the image difference is obtained by comparing the difference between light and dark contrast of the features in the raw images IMGr_1, IMGr_2 and IMGr_3.

If no image difference is detected in the first image-based comparison, the determining circuitry 220 can control the inspection apparatus 230 to capture new raw images IMGr_1, IMGr_2 and IMGr_3 from the semiconductor wafers 100. Furthermore, the determining circuitry 220 provides a diagnostic result Result_Out to indicate that the raw images IMGr_1, IMGr_2 and IMGr_3 are the same.

If the image difference is present, the determining circuitry 220 can perform a second image-based comparison on the reference image IMG_REF and the defect image having one or more image differences, so as to classify the defect types of the image differences in the defect image. As described above, the reference image IMG_REF is obtained from the processing circuitry 210 or the previous raw images IMGr_1, IMGr_2 and IMGr_3 from the inspection apparatus 230. In some embodiments, the determining circuitry 220 determines whether the classified defect type has no effect on the die 110 having the image difference. According to the classified result, the determining circuitry 220 can provide a diagnostic result Result_Out. In some embodiments, the diagnostic result Result_Out indicates whether the defect type of the image difference is normal.

If the diagnostic result Result_Out is normal, the features of the semiconductor wafer 100 are normal in the current process or stage for the semiconductor wafer 100. In response to the diagnostic result Result_Out, the inspection apparatus 230 may continue to diagnose the semiconductor wafer 100 until the dies 110 of the semiconductor wafer 100 are diagnosed. Thus, the semiconductor wafer 100 is unloaded from the inspection apparatus 230 to perform subsequent processes/stages. Conversely, if the diagnostic result Result_Out is abnormal, i.e. the defect is present in the semiconductor wafer 100, the current process or stage is suspended for checking the semiconductor wafer 100.

Figure 9:
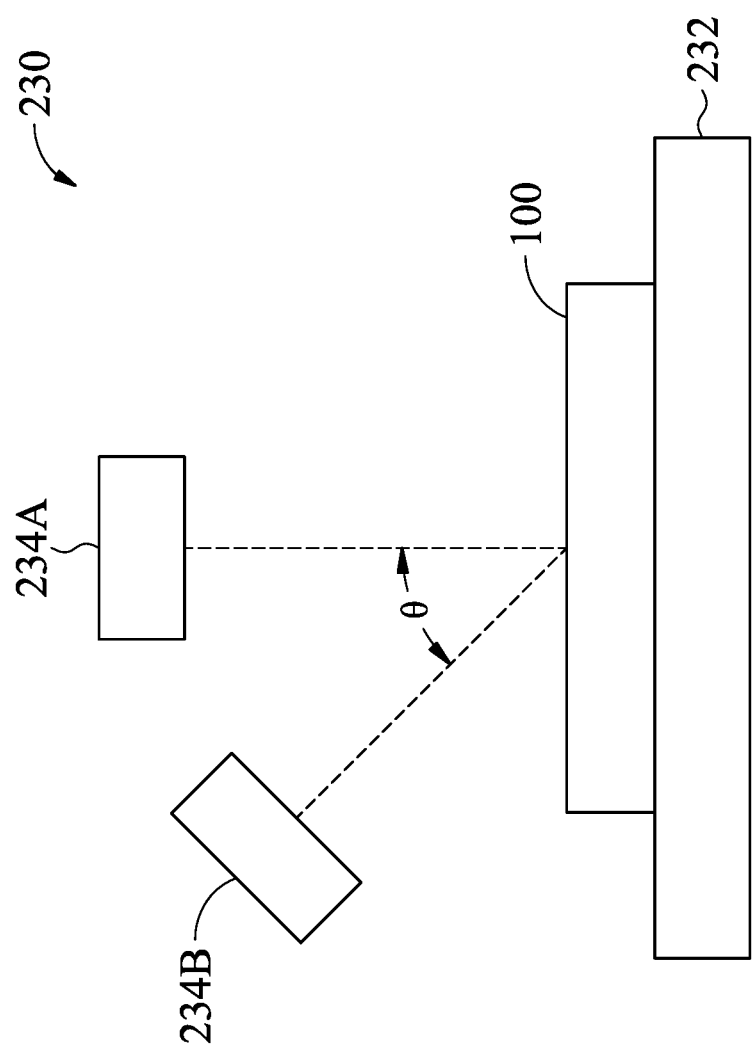
FIG. 9 shows a schematic view illustrating the inspection apparatus of FIG. 8, in accordance with some embodiments of the disclosure.

FIG. 9 shows a schematic view illustrating the inspection apparatus 230 of FIG. 8, in accordance with some embodiments of the disclosure. The inspection apparatus 230 includes a first image capturing device 234A and/or a second image capturing device 234B. The inspection apparatus 230 is capable of capturing the raw images from the semiconductor wafer 100 on a stage 232 via optical, electron beam, UV light, visible light, invisible light, or laser surface scan. In some embodiments, the first image capturing device 234A, the second image capturing device 234B or the stage 232 is movable.

Figure 10A:
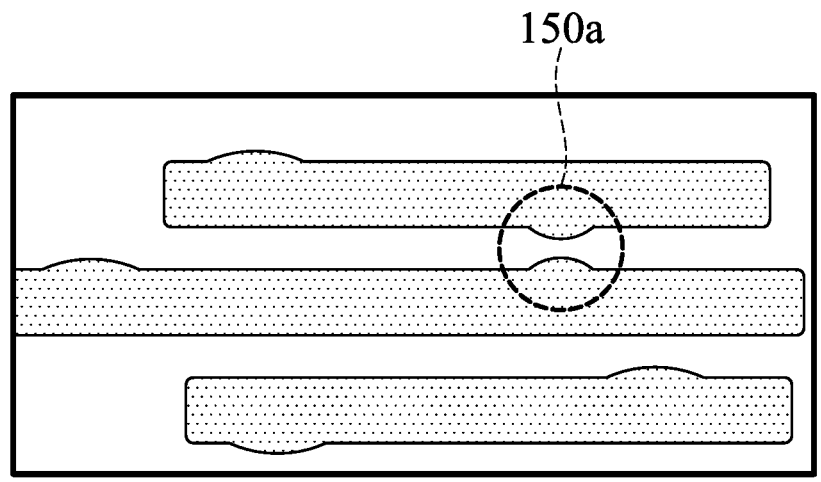
FIG. 10A shows a schematic view illustrating an example of the raw image obtained by the first image capturing device of FIG. 9.

The first image capturing device 234A is arranged to face the top surface of the semiconductor wafer 100, and is configured to capture the raw images (as shown in FIG. 10A) from the semiconductor wafer 100 vertically. The second image capturing device 234B is arranged to face the top surface of the semiconductor wafer 100 with a tilt angle θ, and is configured to capture the raw images (as shown in FIG. 10B) from the semiconductor wafer 100 with the tilt angle θ.

FIG. 10A shows a schematic view illustrating an example of the raw image obtained by the first image capturing device 234A of FIG. 9. In FIG. 10A, by detecting or comparing the raw images obtained by the first image capturing device 234A vertically, the defects (labeled as 150a) will not be diagnosed due to the defects not being completely captured in the raw images.

Figure 10B:
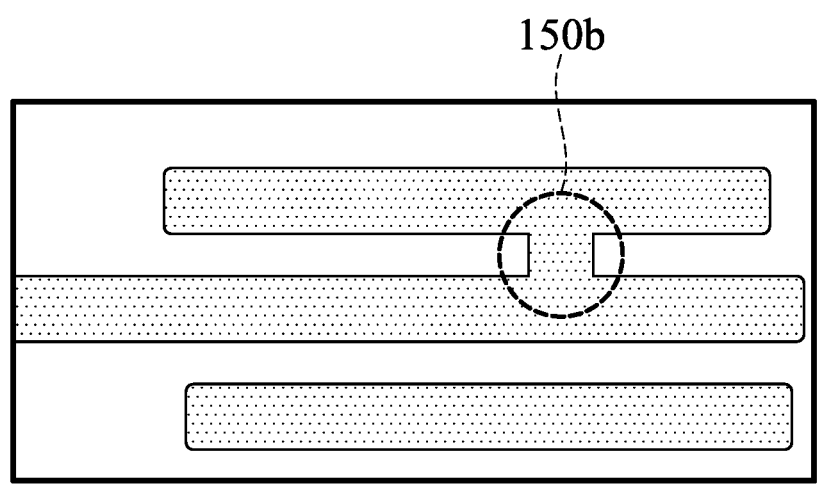
FIG. 10B shows a schematic view illustrating an example of the raw image obtained by the second image capturing device of FIG. 9.

FIG. 10B shows a schematic view illustrating an example of the raw image obtained by the second image capturing device 234B of FIG. 9. In FIG. 10B, by detecting or comparing the raw images obtained by the second image capturing device 234B with the tilt angle θ, the defects (labeled as 150b) can be diagnosed and verify. Therefore, by capturing the raw images at various tilt angles θ, the defects can be accurately diagnosed.

Embodiments for diagnosing a semiconductor wafer are provided. Multiple raw images are obtained according to GDS information of a target die of the semiconductor wafer. The number of raw images is more than two. In some embodiments, the raw images are obtained from different dies of the semiconductor wafer. In some embodiments, the raw images are obtained from different positions in the same die of the semiconductor wafer. A first image-based comparison is performed on the raw images, so as to detect whether one or more image differences are present between the raw images. If the image difference is present in one of the raw images, the raw image having the image difference is assigned as a defect image. A second image-based comparison is performed on a reference image and the defect image, so as to classify the defect type of each image difference. In some embodiments, the reference image is the previous raw image without the image difference or a golden image captured from a golden wafer or a golden die. Furthermore, measurement is accurate by capturing the raw images in the semiconductor wafer according to the GDS information. Thus, process capability index (CPK) is stable, and manufacturing cost (e.g. manpower and tooling time) is decreased.

In some embodiments, a method for diagnosing a semiconductor wafer is provided. A first raw image, a second raw image, and a third raw image of the semiconductor wafer are obtained according to graphic data system (GDS) information regarding layout of a target die, by an inspection apparatus. Determining circuitry performs a first image-based comparison on the first, second, and third raw images, so as to provide a comparison result. The comparison result indicates whether an image difference is present between the first, second, and third raw images.

In some embodiments, a method for diagnosing a semiconductor wafer is provided. By using an inspection apparatus, a plurality of raw images from a plurality of positions of the semiconductor wafer are obtained, respectively. By using a determining circuitry, a first image-based comparison is performed on the plurality of raw images, so as to detect whether an image difference is present between the plurality of raw images. The raw image having the image difference is assigned as a defect image. By using the determining circuitry, a second image-based comparison is performed on a reference image and the defect image, so as to classify a defect type of the image difference.

In some embodiments, a system for diagnosing a semiconductor wafer is provided. The system includes a processing circuitry, an inspection apparatus, and a determining circuitry. The processing circuitry is configured to provide graphic data system (GDS) information of a layout in the semiconductor wafer. The inspection apparatus is configured to obtain a first raw image, a second raw image, and a third raw image from the semiconductor wafer according to the GDS information from the processing circuitry. The determining circuitry is configured to receive the first, second, and third raw images from the e inspection apparatus, and to perform a first image-based comparison on the first, second, and third raw images to detect whether an image difference is present between the first, second, and third raw images.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for diagnosing a semiconductor wafer, comprising:
    obtaining a first raw image, a second raw image, and a third raw image of the semiconductor wafer according to graphic data system (GDS) information regarding a layout of a target die, by an inspection apparatus;
    performing a first image-based comparison on the first, second and third raw images, so as to provide a comparison result, by a determining circuitry, wherein the comparison result indicates whether an image difference is present between the first, second, and third raw images;
    assigning the first, second, or third raw image having the image difference as a defect image; and
    performing a second image-based comparison on a reference image and the defect image, so as to classify a defect type of the image difference, by the determining circuitry,
    wherein the reference image is captured from a golden wafer.

2. The method as claimed in claim 1, further comprising: determining whether the classified defect type has effect on a die of the semiconductor wafer corresponding to the defect image.

3. The method as claimed in claim 1, wherein obtaining the first, second, and third raw images of the semiconductor wafer according to the GDS information of the layout further comprises:
    capturing the first raw image from a first position in a first die of the semiconductor wafer;
    capturing the second raw image from a second position in a second die of the semiconductor wafer; and
    capturing the third raw image from a third position in a third die of the semiconductor wafer,
    wherein the first, second, and third dies have individual coordinates in the semiconductor wafer,
    wherein the first, second, and third positions correspond to the same coordinates of the target die.

4. The method as claimed in claim 1, wherein obtaining the first, second, and third raw images of the semiconductor wafer according to the GDS information of the layout further comprises:
    capturing the first raw image from a first position in a first die of the semiconductor wafer;
    capturing the second raw image from a second position in the first die of the semiconductor wafer; and
    capturing the third raw image from a third position in the first die of the semiconductor wafer,
    wherein the first, second, and third positions have individual coordinates in the first die.

5. The method as claimed in claim 1, wherein the first, second, and third raw images are obtained by capturing the first, second, and third raw images vertically from the semiconductor wafer via optical, electron beam, UV light, visible light, invisible light, or laser surface scan.

6. The method as claimed in claim 1, wherein the first, second, and third raw images are obtained by capturing the first, second, and third raw images with a tilt angle from the semiconductor wafer via optical, electron beam, UV light, visible light, invisible light, or laser surface scan.

7. The method as claimed in claim 1, wherein the layout comprises a multi-layer structure of the target die.

8. The method as claimed in claim 1, wherein the GDS information comprises information regarding coordinates and patterns prone to defects in the layout of the target die.

9. A method for diagnosing a semiconductor wafer, comprising:
    obtaining, using an inspection apparatus, a plurality of raw images from a plurality of positions of the semiconductor wafer according to graphic data system (GDS) information regarding a layout of a target die, respectively;
    performing, using a determining circuitry, a first image-based comparison on the plurality of raw images, so as to detect whether an image difference is present between the plurality of raw images;
    assigning the raw image having the image difference as a defect image; and
    performing, using the determining circuitry, a second image-based comparison on a reference image and the defect image, so as to classify a defect type of the image difference,
    wherein the layout of the target die comprises a circuit with a duplicate layout formed by a plurality of same cells.

10. The method as claimed in claim 9, wherein the number of the plurality of raw images is greater than or equal to 3.

11. The method as claimed in claim 9, wherein obtaining the plurality of raw images from the plurality of positions of the semiconductor wafer, respectively, further comprises:
    capturing a first raw image from a first position in a first die of the semiconductor wafer;
    capturing a second raw image from a second position in a second die of the semiconductor wafer; and
    capturing a third raw image from a third position in a third die of the semiconductor wafer,
    wherein the first, second, and third dies have individual coordinates in the semiconductor wafer,
    wherein the first, second, and third positions are determined according to the GDS information.

12. The method as claimed in claim 11, wherein the layout comprises a multi-layer structure of the target die.

13. The method as claimed in claim 9, wherein obtaining the plurality of raw images from the plurality of positions of the semiconductor wafer, respectively, further comprises:
- capturing a first raw image from a first position in a first die of the semiconductor wafer;
- capturing a second raw image from a second position in the first die of the semiconductor wafer; and
- capturing a third raw image from a third position in the first die of the semiconductor wafer,
- wherein the first, second, and third positions have individual coordinates in the first die.

14. A system for diagnosing a semiconductor wafer, comprising:
- a processing circuitry configured to provide graphic data system (GDS) information of layout of a target die;
- an inspection apparatus configured to obtain a first raw image, a second raw image, and a third raw image from the semiconductor wafer according to the GDS information from the processing circuitry; and
- a determining circuitry configured to receive the first, second, and third raw images from the inspection apparatus, and to perform a first image-based comparison on the first, second, and third raw images to detect whether an image difference is present between the first, second, and third raw images,
- wherein when the image difference is present between the first, second, and third raw images, the determining circuitry is configured to assign the first, second, or third raw image having the image difference as a defect image, wherein the determining circuitry is configured to perform a second image-based comparison on a reference image and the defect image, so as to classify a defect type of the image difference,
- wherein the reference image is captured from a golden wafer.

15. The system as claimed in claim 14, wherein the layout comprises a multi-layer structure of the target die.

16. The system as claimed in claim 14, wherein the inspection apparatus is configured to capture the first raw image from a first position in a first die of the semiconductor wafer, the second raw image from a second position in a second die of the semiconductor wafer, and the third raw image from a third position in a third die of the semiconductor wafer, wherein the first, second, and third positions correspond to the same coordinates of the target die.

17. The system as claimed in claim 14, wherein the inspection apparatus is configured to capture the first, second, and third raw images from a first position, a second position and a third position in a first die of the semiconductor wafer, wherein the first, second, and third positions have individual coordinates in the first die.

18. The system as claimed in claim 14, wherein the inspection apparatus is configured to capture the first, second, and third raw images vertically via optical, electron beam, UV light, visible light, invisible light, or laser surface scan.

19. The system as claimed in claim 14, wherein the inspection apparatus is configured to capture the first, second, and third raw images with a tilt angle via optical, electron beam, UV light, visible light, invisible light, or laser surface scan.

20. The system as claimed in claim 14, wherein the GDS information comprises information regarding coordinates and patterns prone to defects in the layout of the target die.

* * * * *